United States Patent
Yelamos Ruiz et al.

(10) Patent No.: US 11,349,474 B1
(45) Date of Patent: May 31, 2022

(54) CASCADED GATE DRIVER OUTPUTS FOR POWER CONVERSION CIRCUITS

(71) Applicant: Infineon Technologies Austria AG, Villach (AT)

(72) Inventors: Pablo Yelamos Ruiz, Hermosa Beach, CA (US); Venkata Anand Prabhala, El Segundo, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/209,282

(22) Filed: Mar. 23, 2021

(51) Int. Cl.
| | |
|---|---|
| H03K 3/00 | (2006.01) |
| H03K 17/567 | (2006.01) |
| H02M 3/158 | (2006.01) |
| G05F 1/00 | (2006.01) |
| H03K 17/284 | (2006.01) |
| H03K 17/687 | (2006.01) |
| H02P 27/06 | (2006.01) |
| G01R 19/145 | (2006.01) |
| H03K 17/06 | (2006.01) |

(52) U.S. Cl.
CPC ......... *H03K 17/284* (2013.01); *G01R 19/145* (2013.01); *H02P 27/06* (2013.01); *H03K 17/063* (2013.01); *H03K 17/6871* (2013.01)

(58) Field of Classification Search
None
See application file for complete search history.

(56) References Cited

U.S. PATENT DOCUMENTS

| | | | | |
|---|---|---|---|---|
| 4,356,408 | A * | 10/1982 | Glennon | H03K 17/04126 327/405 |
| 6,249,111 | B1 * | 6/2001 | Nguyen | H02M 3/1588 323/282 |
| 6,930,473 | B2 * | 8/2005 | Elbanhawy | H02M 3/1584 323/282 |
| 7,994,769 | B2 * | 8/2011 | Ohtake | H03K 17/122 323/283 |
| 8,461,793 | B2 * | 6/2013 | Ohshima | H02P 7/29 318/503 |
| 9,425,691 | B1 * | 8/2016 | Miyamae | H02M 3/158 |
| 10,348,294 | B2 * | 7/2019 | Nagase | H03K 17/0822 |
| 10,756,722 | B2 * | 8/2020 | Korner | H03K 17/122 |

* cited by examiner

*Primary Examiner* — Kenneth B Wells
(74) *Attorney, Agent, or Firm* — Murphy, Bilak & Homiller, PLLC

(57) ABSTRACT

A gate driver circuit includes at least one driver configured to generate a first gate control signal for a first power disconnect switch and a second gate control signal for a second power disconnect switch in parallel with the first power disconnect switch, and logic configured to implement a delayed turn on time for the second gate control signal compared to the first gate control signal such that the first power disconnect switch turns on before the second power disconnect switch when powering up a load coupled to the first and the second power disconnect switches. The gate driver circuit logic may also be configured to implement a delayed turn off time such that the first power disconnect switch turns off before the second power disconnect switch when powering down the load. Corresponding power conversion circuits, electronic systems, and methods of power disconnect switch control are also described.

29 Claims, 11 Drawing Sheets

CASCADED GATE DRIVER OUTPUTS FOR POWER CONVERSION CIRCUITS

BACKGROUND

Many battery-powered motor drive and other power electronic systems use n-channel MOSFETs (metal-oxide-semiconductor field-effect transistors) or Linear FETs as solid state disconnect switches for hot swap, electronic fuse and battery protection applications. When these systems are powered on, a bulk capacitor at the system input draws a large inrush current which can be many times higher than nominal operating currents. The solid state disconnect switches are introduced to limit the inrush current by having a controlled charging of the bulk capacitor during startup, and for disconnecting the system from the supply/battery in case of a fault.

Depending on the peak currents during inrush and short circuit conditions, either a single MOSFET or several MOSFETs in parallel are typically used as a disconnect switch. If standard MOSFETs are used as disconnect switches, the inrush current is not limited during system power on. Furthermore, when standard MOSFETs are connected in parallel, unequal current sharing occurs during inrush current transients. This results in coupling more standard MOSFETs in parallel to compensate for unequal current sharing.

Another method is to carefully select standard MOSFETs with matching Vth (threshold voltage) values which is expensive. Also, standard MOSFETs are typically selected as disconnect switches with the assumption that a single MOSFET will take over the entire inrush current as equal current sharing among MOSFETs cannot be guaranteed which represents an additional cost. For these reasons and others, Linear FETs have been proposed for limiting inrush current and equal current sharing during inrush transients when paralleled. Linear FET technology combines the low RDSon (on-state resistance) of a trench MOSFET with the wide safe operating area (SOA) of a planar MOSFET. Linear FETs have faster turn off compared to standard MOSFETs. However, faster turn off can lead to avalanching of the device which can result in failure and adversely affect system reliability.

Thus, there is a need for an improved disconnect switch approach for power electronic systems.

SUMMARY

According to an embodiment of a gate driver circuit, the gate drive circuit comprises: at least one driver configured to generate a first gate control signal for a first power disconnect switch and a second gate control signal for a second power disconnect switch in parallel with the first power disconnect switch; and logic configured to implement a delayed turn on time for the second gate control signal compared to the first gate control signal such that the first power disconnect switch turns on before the second power disconnect switch when powering up a load coupled to the first and the second power disconnect switches.

According to an embodiment of a power conversion circuit, the power conversion circuit comprises: an inverter/converter; a capacitor electrically coupled to a power input node of the inverter/converter; a first transistor electrically coupled between a power input node of the power conversion circuit and the power input node of the inverter/converter; a second transistor in parallel with the first transistor and electrically coupled between the power input node of the power conversion circuit and the power input node of the inverter/converter; a controller configured to operate the first transistor and the second transistor as disconnect switches when disconnecting the power input node of the power conversion circuit from the power input node of the inverter/converter; and a gate driver circuit configured to generate a first gate control signal for the first transistor and a second gate control signal for the second transistor, the second gate control signal having a delayed turn on time compared to the first gate control signal such that the first transistor turns on before the second transistor when powering up a load coupled to the first and the second power disconnect switches.

According to an embodiment of an electronic system, the electronic system comprises: a load; an inverter/converter coupled to the load; a capacitor electrically coupled to a power input node of the inverter/converter; a power source; a first transistor electrically coupled between the power source and the power input node of the inverter/converter; a second transistor in parallel with the first transistor and electrically coupled between the power source and the power input node of the inverter/converter; a controller configured to operate the first transistor and the second transistor as disconnect switches when disconnecting the power source from the load; and a gate driver circuit configured to generate a first gate control signal for the first transistor and a second gate control signal for the second transistor, the second gate control signal having a delayed turn on time compared to the first gate control signal such that the first transistor turns on before the second transistor when powering up the load.

According to an embodiment of a method of driving a first power disconnect switch and a second power disconnect switch coupled in parallel with the first power disconnect switch, the method comprises: generating a first gate control signal for the first power disconnect switch and a second gate control signal for the second power disconnect switch; and implementing a delayed turn on time for the second gate control signal compared to the first gate control signal such that the first power disconnect switch turns on before the second power disconnect switch when powering up a load coupled to the first and the second power disconnect switches.

According to an embodiment of a power conversion circuit, the power conversion circuit comprises: an inverter/converter; a bulk capacitor electrically coupled to a power input node of the inverter/converter; a first transistor electrically coupled between a power input node of the power conversion circuit and the power input node of the inverter/converter; a second transistor in parallel with the first transistor and electrically coupled between the power input node of the power conversion circuit and the power input node of the inverter/converter; a controller configured to operate the first transistor and the second transistor as disconnect switches when disconnecting the power input node of the power conversion circuit from the power input node of the inverter/converter; and a gate driver circuit configured to generate a first gate control signal for the first transistor and a second gate control signal for the second transistor, the second gate control signal having a delayed turn on time compared to the first gate control signal such that the first transistor turns on before the second transistor and the capacitor begins to draw an inrush current through the first transistor but not the second transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a gate driver circuit with two or more outputs and having configurable turn on and/or configurable turn off delay introduced between the outputs such that a first power disconnect switch turns on first to limit the inrush current during power on events and a second power disconnect switch with a delayed turn on time relative to the first power disconnect switch to reduce system power losses during normal operation. Similar delayed sequencing may occur during turn off events in that the first power disconnect switch may turn off first followed by the second power disconnect switch to provide a controlled turn off at high currents which avoids avalanching of the disconnect switch.

The delay may be introduced in the gate driver by analog or digital implementation and may be programmable or defined by measurement, calibration, etc. or may be fixed. For example, in the case of a measurement-based implementation, inrush current sensing may be implemented via a series resistor or RDSon sensing using a comparator. After a certain threshold is reached, the second power disconnect switch may be turned on. The turn-on delay implemented by the gate driver circuit instead may be a constant value such that no additional sense circuitry is needed. During turn off, the first power disconnect switch is turned off immediately in response to system or controller protection or a normal shutdown sequence. The second power disconnect switch may be turned off in a controlled manner after a delay from when the first power disconnect switch is turned off, to avoid avalanching. In some cases, just the turn on delay may be implemented. In other cases, just the turn off delay may be implemented. In yet other cases, both the turn on delay and the turn off delay may be implemented.

Described next with reference to the figures are embodiments of the improved disconnect switch approach, and corresponding power conversion circuits, electronic systems, and methods of power disconnect switch control.

Figure 1:
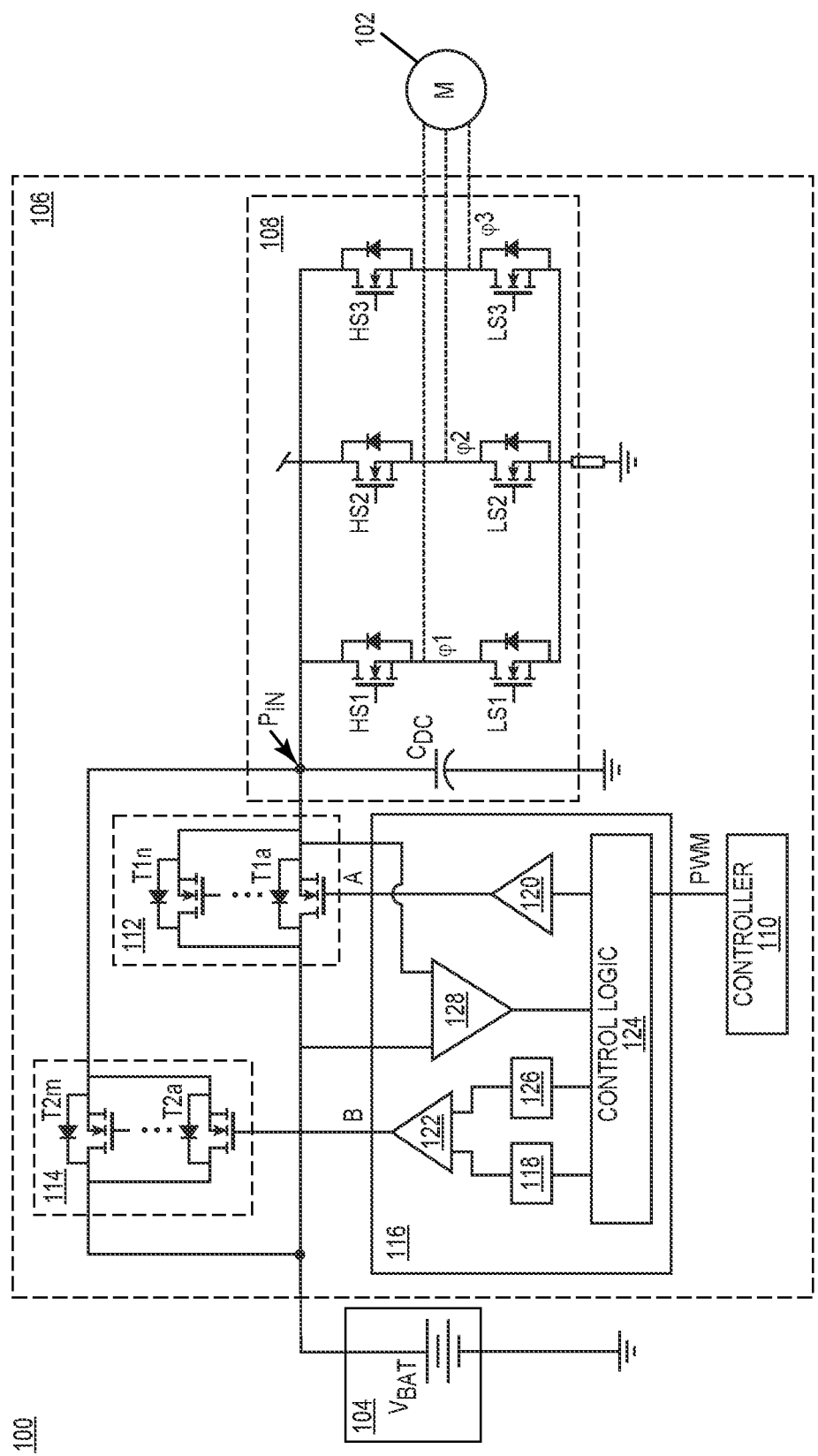
FIG. 1 illustrates a block diagram of an embodiment of an electronic system that includes a load, a power source, and power conversion circuit coupled between the load and the power source.

FIG. 1 illustrates an embodiment of an electronic system 100 that includes a load 102, a power source 104, and power conversion circuit 106 coupled between the load 102 and the power source 104. Whether power inversion or conversion occurs between the power source 104 and the load 102 depends on the type of electronic system 100. In one embodiment, the power source 104 is a battery '$V_{BAT}$', the load 102 is a multi-phase motor 'M', and the power conversion circuit 106 inverts a DC voltage from the battery $V_{BAT}$ to an ac voltage applied to the multi-phase motor M. For example, the motor may be a 3-phase motor and the power conversion circuit 106 may include three half bridges each including a high-side power transistor HSn coupled in series to a low-side power transistor LSn between a power input node $P_{IN}$ of an inverter/converter 108 and ground to form a respective phase input φn to the 3-phase motor M. In this case, the inverter/converter 108 functions as an inverter. However, if the power source 104 is instead an ac source, the inverter/converter 108 functions as a converter. The inverter/converter 108 may have other configurations such as full bridge, synchronous rectifier, etc., depending on the type of application.

In general, the power conversion circuit 106 also includes a bulk or dc bus capacitor $C_{DC}$ electrically coupled to the power input node $P_{IN}$ of the inverter/converter 108. The power conversion circuit 106 further includes at least one first transistor T1a electrically coupled between the power source 104 and the power input node $P_{IN}$ of the inverter/converter 108, and at least one second transistor T2a in parallel with the at least one first transistor T1a and electrically coupled between the power source 104 and the power input node $P_{IN}$ of the inverter/converter 108.

The power conversion circuit 106 further includes a controller 110 such as a microcontroller, CPU (central processing unit), etc. that operates the at least one first transistor T1a and the at least one second transistor T2a as respective first and second disconnect switches 112, 114 when disconnecting the power source 104 from the load 102, e.g., as part of hot swap, electronic fuse and/or battery protection applications.

The at least one first transistor T1a that forms the first disconnect switch 112 is a different type of transistor or a transistor with a different type of operating characteristic (e.g., gate charge) compared to the at least one second transistor T2a that forms the second disconnect switch 114. For example, the at least one first transistor T1a that forms the first disconnect switch 112 is better suited for limiting the inrush current flowing into the power input node $P_{IN}$ of the inverter/converter 108 during power on of the load 102 whereas the at least one second transistor T2a that forms the second disconnect switch 114 provides lower RDSon during normal operation of the load 102.

In one embodiment, the first power disconnect switch 112 is realized by a plurality of first transistors T1a . . . T1n coupled in parallel and controlled by the same first gate control signal 'A'. The second power disconnect switch 114 similarly may be realized by a plurality of second transistors T2a . . . T2m coupled in parallel and controlled by the same second gate control signal 'B'. The first power disconnect switch 112 and the second power disconnect switch 114 may have an equal or different number of transistors. That is, m=n or m≠n where m≥1 and n≥1. Depending on the type of application in which the electronic system 100 is deployed, one or both of the power disconnect switches 112, 114 may only include a single transistor.

A gate driver circuit 116 of the power conversion circuit 106 generates the first gate control signal A for each first transistor T1a . . . T1n that forms the first power disconnect switch 112 and generates the second gate control signal B for each second transistor T2a . . . T2m that forms the second power disconnect switch 114. When powering up the load 102, the gate driver circuit 116 generates the gate control signals A, B such that the second gate control signal B has a delayed turn on time compared to the first gate control signal A. Accordingly, each first transistor T1a ... T1n of the first power disconnect switch 112 turns on before each second transistor T2a ... T2m of the second power disconnect switch 114.

Figure 2:
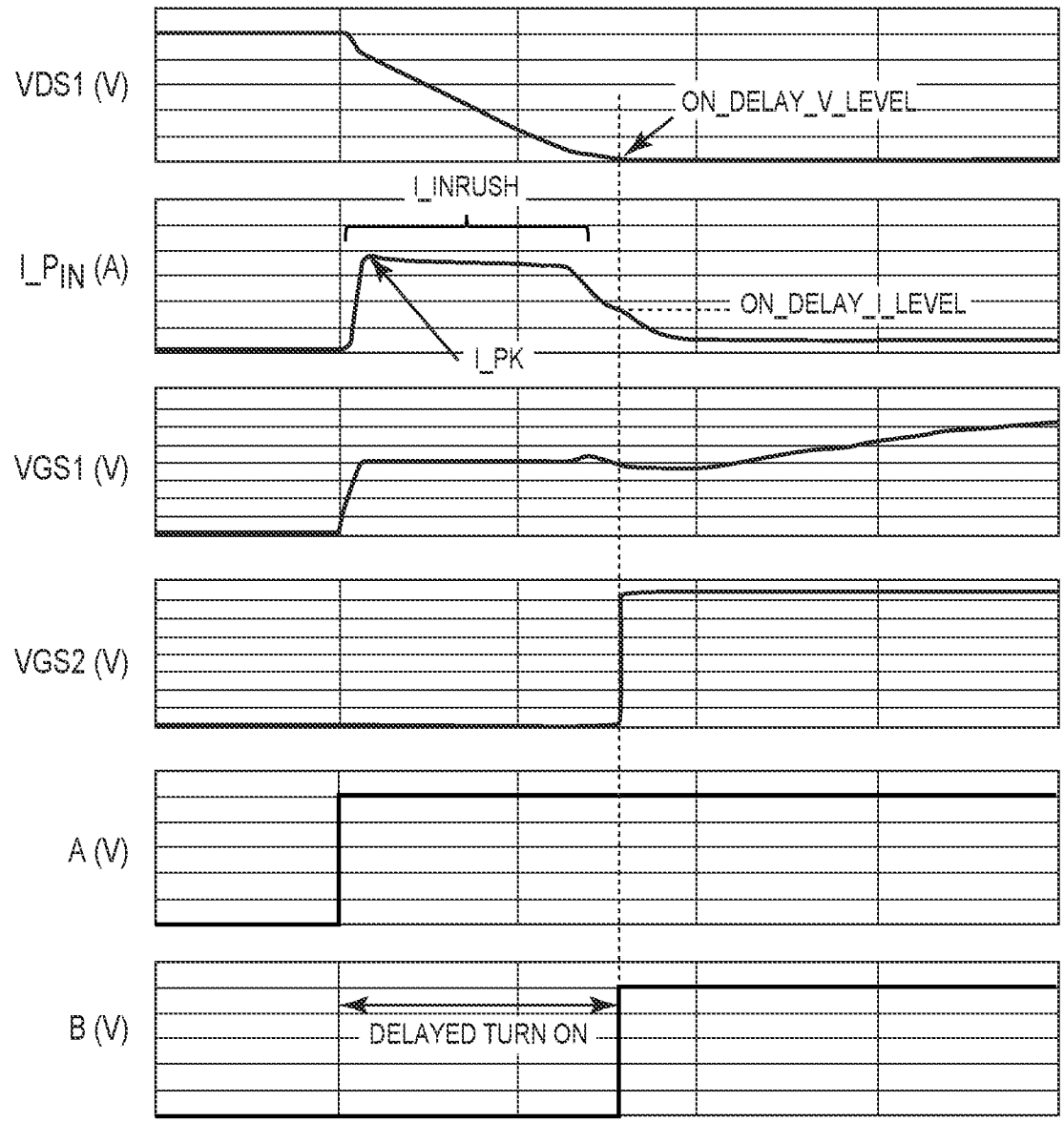
FIG. 2 illustrates various waveforms associated with powering-up the load.

FIG. 2 illustrates various waveforms associated with powering-up the load 102. FIG. 2 shows the first gate control signal A in volts (V), the second gate control signal B in volts (V), the gate-to-source voltage VGS1 of the first power disconnect switch 112 in volts (V), the gate-to-source voltage VGS2 of the second power disconnect switch 114 in volts (V), the drain-to-source voltage VDS1 of the first power disconnect switch 112 in volts (V), and the current $I\_P_{IN}$ flowing into the power input node $P_{IN}$ of the inverter/converter 104 in amperes (A).

As shown in FIG. 2, the gate driver circuit 116 generates the gate control signals A, B such that the second gate control signal B has a delayed turn on time compared to the first gate control signal A when powering up the load 102. Accordingly, the gate-to-source voltage VGS1 of the first power disconnect switch 112 rises before the gate-to-source voltage VGS2 of the second power disconnect switch 114, causing the first power disconnect switch 112 to turn on and begin conducting current before the second power disconnect switch 114. When the first power disconnect switch 112 turns on, current $I\_P_{IN}$ begins flowing into the power input node $P_{IN}$ of the inverter/converter 104 as the bulk or dc bus capacitor $C_{DC}$ charges.

The delay imparted by the gate driver circuit 116 to the second gate control signal B may be fixed, programmable, calculated, calibrated, etc. such that the inrush current I_inrush flowing into the power input node $P_{IN}$ of the inverter/converter 104 reaches a peak I_pk and then begins to drop to a lower level (On_delay_I_level) before the second power disconnect switch 114 is turned on. In one embodiment, each first transistor T1a ... T1n of the first power disconnect switch 112 is a Linear FET and each second transistor T2a ... T2m of the second power disconnect switch 114 is a transistor type other than a Linear FET like standard MOSFETs, e.g., a planar MOSFET or a trench MOSFET.

Trench MOSFETs have a significantly smaller RDSon compared to planar MOSFETs for the same chip area and significantly reduce overall conduction losses. Trench MOSFETs also have substantially steeper transfer characteristics which results in a narrowing of the safe operating area (SOA) which exhibits clear limitations during the linear mode operation of the device, which can be in the millisecond range. For example, hot swap applications require a disconnect switch to slowly turn on in the few hundreds of microseconds to few tens of millisecond range with currents as high as the MOSFET can withstand, i.e., wide SOA capable. Hot swap applications also require low RDSon for the normally-on operating condition. Linear FETs such as the OptiMOS™ Linear FET manufactured and sold by Infineon Technologies and which combine the low RDSon of a trench MOSFET with the broad safe operating area SOA of a planar MOSFET.

Figure 3B:
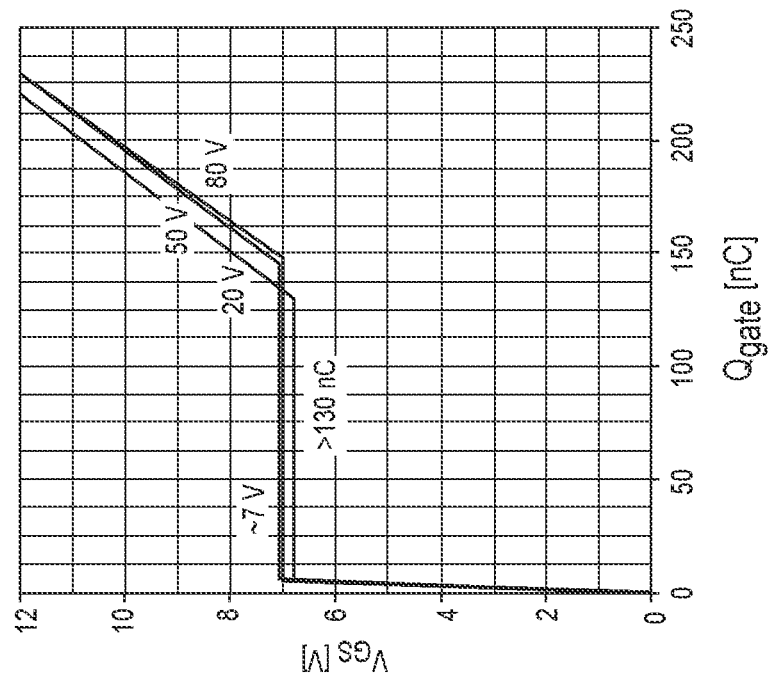
FIG. 3A plots gate charge characteristics for a typical standard MOSFET disconnect switch and FIG. 3B plots gate charge characteristics for a Linear FET disconnect switch.
Figure 3A:
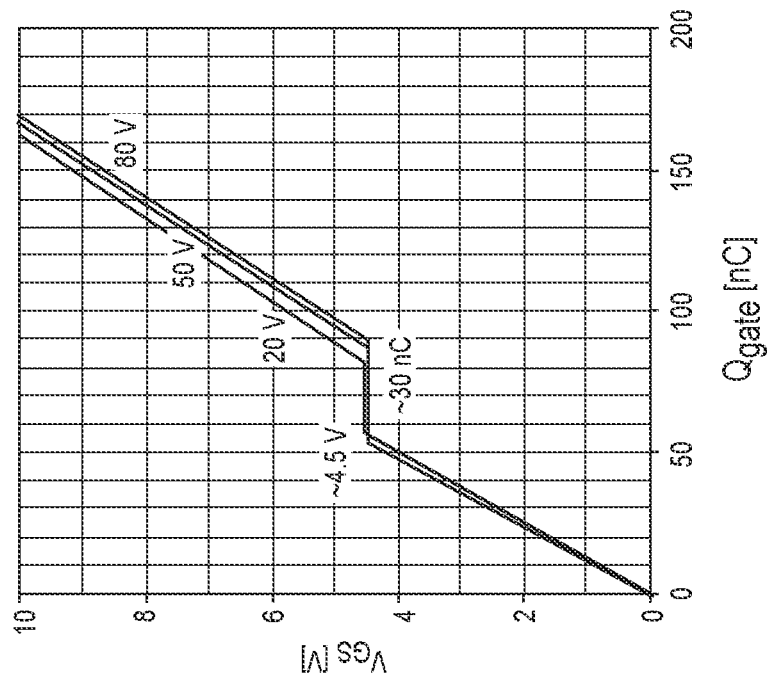

FIG. 3A plots gate charge characteristics for a typical trench MOSFET whereas FIG. 3B plots gate charge characteristics for a Linear FET. The x-axis in both graphs represents gate charge (Qgate) in nano coulombs (nC) and the y-axis in both graphs represents gate-to-source voltage ($V_{GS}$) in volts (V). The gate charge characteristics are plotted for three different operating voltages: 20V, 50V and 80V. As FIGS. 3A and 3B demonstrate, the Linear FET has a higher plateau voltage (~7V versus ~4.5V in this example) and a wider gate to drain charge capability. That is, the Miller plateau can be reached for the Linear FET with a much lower charge (approximately 10 nC vs. approximately 55 nC) and the Linear FET enters linear mode more effortlessly. The Linear FET then stays in the plateau region longer due to higher gate to drain charge needed to completely charge the MOSFET (more than 130 nC vs. approximately 30 nC).

Implementing the first power disconnect switch 112 as one or more Linear FETs provides for a controlled turn-on, thereby limiting the inrush current I_inrush flowing into the power input node $P_{IN}$ of the inverter/converter 104. This is, however, just one example. Other transistor types may be used for the first power disconnect switch 112 to provide better inrush current control compared to the second power disconnect switch 112.

The second power disconnect switch 112 may be optimized for low RDSon during normal operation. For example, a plurality of trench MOSFETs may be coupled in parallel to reduce RDSon during normal operation. Any threshold variation between the paralleled trench MOSFETs should have no effect on inrush current limiting capability during power on, since the gate driver circuit 116 delays the second gate control signal B applied to the second power disconnect switch 114 relative to the first gate control signal A applied to the first power disconnect switch 112. Accordingly, the first power disconnect switch 112 is switched on before the second power disconnect switch 114 and therefore handles/limits the inrush current I_inrush without contribution from the second power disconnect switch 114. The delay in the activation of the second gate control signal B is implemented such that the second power disconnect switch 114 turns on via the second gate control signal B after the peak inrush current I_pk subsides, e.g., as shown in FIG. 2.

In addition to or separately from the delayed turn on embodiments described herein, the gate driver circuit 116 may generate the gate control signals A, B such that the second gate control signal B has a delayed turn off time compared to the first gate control signal A when powering down the load 102. According to this aspect, each first transistor T1a ... T1n of the first power disconnect switch 112 turns off before each second transistor T2a ... T2m of the second power disconnect switch 114 when powering down the load 102. Such turn off sequencing ensures that the second power disconnect switch 114 may have a controlled turn off when powering down the load 102.

In the case of implementing the first power disconnect switch 112 as one or more Linear FETs and implementing the second power disconnect switch 114 as one or more standard MOSFETs like trench MOSFETs, each Linear FET is turned off first when powering down the load 102 so as to avoid fast turn off avalanching and/or excessive ringing across the drain-to-source voltage of the Linear FET(s). Turning off the second power disconnect switch 114 after the first power disconnect switch 112 has been turned off allows for a safe and controlled turn-off process. Implementing both the turn on delay and the turn off delay approaches in conjunction allows for inrush current control during power on of the load 102 and for safe/controlled powering down of the load 102.

Figure 4:
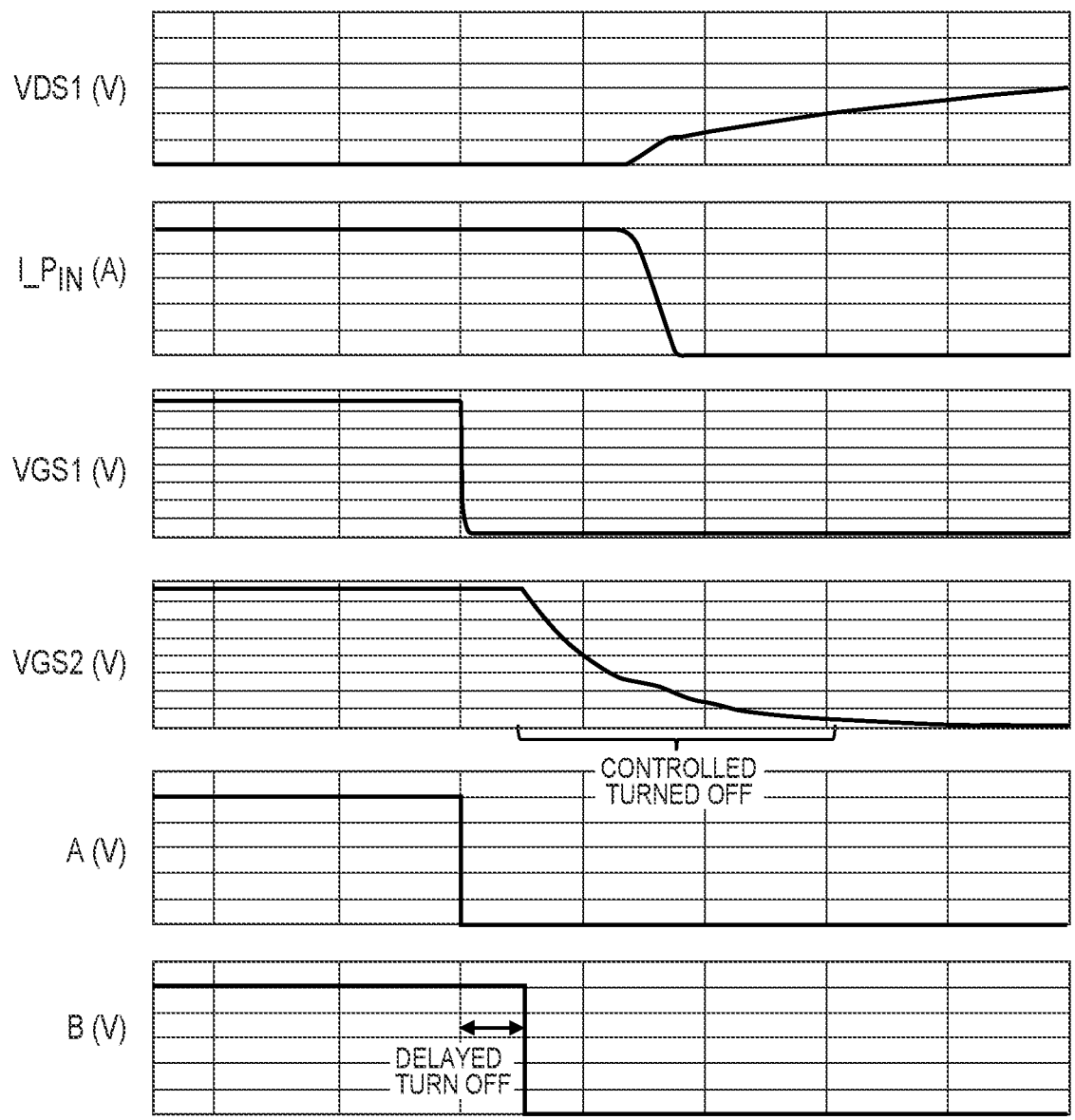
FIG. 4 illustrates various waveforms associated with powering-down the load.

FIG. 4 illustrates various waveforms associated with powering-down the load 102. FIG. 4 shows the first gate control signal A in volts (V), the second gate control signal B in volts (V), the gate-to-source voltage VGS1 of the first power disconnect switch 112 in volts (V), the gate-to-source voltage VGS2 of the second power disconnect switch 114 in volts (V), the drain-to-source voltage VDS1 of the first power disconnect switch 112 in volts (V), and the current I_P$_{IN}$ flowing into the power input node P$_{IN}$ of the inverter/converter 104 in amperes (A).

As shown in FIG. 4, the gate driver circuit 116 generates the gate control signals A, B such that the second gate control signal B has a delayed turn off time compared to the first gate control signal A when powering down the load 102. Initiating a controlled turn off of the second power disconnect switch 114 after first turning off the first power disconnect switch 112 provides for improved control of the drain-to-source voltage VDS1 of the first power disconnect switch 112 which in turn avoids VDS ringing at the first power disconnect switch 112 and avoids avalanche. In one embodiment, the delayed turn off time is such that the first power disconnect switch 112 is completely turned off before the second power disconnect switch 114 begins to turn off.

As explained above, the delay between the gate control signals A, B may be fixed, programmable, calculated, calibrated, etc. Described next are various embodiments of determining the delay between the gate control signals A, B.

Referring to FIG. 1, the gate driver circuit 116 may implement the delayed turn on time for the second gate control signal B based on a programmed delay value 118 which may be fixed (i.e., programmed once) or re-programmable. In one embodiment, the gate driver circuit 116 includes a first driver 120 for driving the gate of each first transistor T1$a$ ... T1$n$ that forms the first power disconnect switch 112 and a second driver 122 for driving the gate of each second transistor T2$a$ ... T2$m$ that forms the second power disconnect switch 114.

Logic 124 included in the gate driver circuit 116 applies a switching control signal PWM received from the controller 110 as input to the first driver 120 which in turn generates the first gate control signal A without adding any intentional delay. The gate driver circuit logic 124 applies the delayed turn on time indicated by the corresponding programmed delay value 118 to the switching control signal PWM as input to the second driver 122 which in turn generates the second gate control signal B with the intentionally added delay. Accordingly, the first power disconnect switch 112 turns on before the second power disconnect switch 114 when powering up the load 102 such that the first power disconnect switch 112 limits the inrush current I_inrush while the second power disconnect switch 114 remains switched off. The programmed delay value 118 may be programmed or determined such that the inrush current I_inrush reaches a peak I_pk and begins to drop to a lower level On_delay_I_level before the second power disconnect switch 114 is turned on, e.g., as shown in FIG. 2.

Regarding delayed turn-off of the second power disconnect switch 114 when powering down the load 102, the gate driver circuit 116 may implement the delayed turn off time for the second gate control signal B based on a corresponding programmed delay value 126 which may be fixed or re-programmable. For example, the gate driver circuit logic 124 applies the switching control signal PWM received from the controller 110 as input to the first driver 120 without adding any intentional delay. The gate driver circuit logic 124 applies the delayed turn on time indicated by the corresponding programmed delay value 126 to the switching control signal PWM for input to the second driver 122. Accordingly, the first power disconnect switch 112 turns off before the second power disconnect switch 114 when powering down the load 102 so as to avoid fast turn off avalanching and/or excessive VDS ringing at the first power disconnect switch 112.

The programmed turn-off delay value 126 may be programmed or determined to allow for a controlled turn off of the second power disconnect switch 114. For example, gate resistance may be added to the second power disconnect switch 114 and/or the second driver 122 may include a controlled-current gate driver circuit for turning off the second power disconnect switch 114 in a controlled manner. Controlled turn-off of the second power disconnect switch 114 includes slowly decreasing the gate-to-source voltage (VGS2) of the second power disconnect switch 114 in a controlled manner as shown in FIG. 4. When the gate-to-source voltage VGS2 of the second power disconnect switch 114 is low enough, the current I_P$_{IN}$ is switched off as shown in FIG. 4. For example, the slew rate of the gate-to-source voltage (VGS2) of each second transistor T2$a$ ... T2$m$ that forms the second power disconnect switch 114 may be in a range of 1 μs to 1 ms to turn off the second power disconnect switch 114 in a controlled manner.

Regarding delayed turn-on of the second power disconnect switch 114 when powering up the load 102, FIG. 1 illustrates an embodiment of implementing the delayed turn-on time 118 for the second power disconnect switch 114 that includes a sensor 128 for sensing the drain-to-source voltage (VDS1) of the first power disconnect switch 112 or a current flowing through the first power disconnect switch 112. The gate driver circuit logic 124 implements the delayed turn on time based on the sensed drain-to-source voltage VDS1 or the sensed current. For example, the second gate control signal B may be activated when the sensed drain-to-source voltage VDS1 drops below a certain voltage level, e.g., 'On_delay_V_level' in FIG. 2 or when the sensed transistor current drops below a certain current level, e.g., similar to what is shown in FIG. 2 for I_P$_{IN}$.

Figure 5:
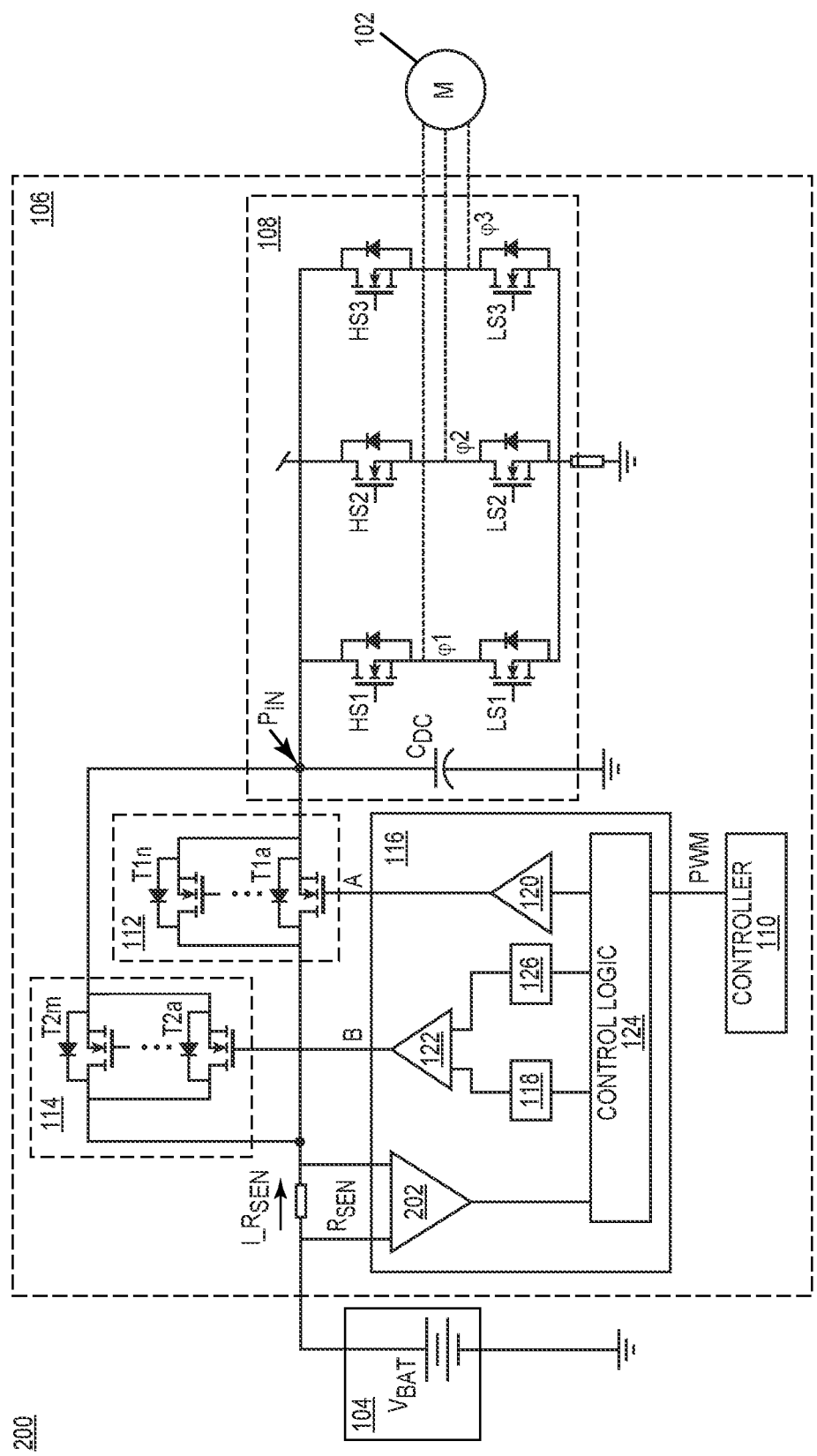
FIGS. 5 through 11 illustrate additional embodiments of respective electronic systems that include the power conversion circuit coupled between the load and the power source.

FIG. 5 illustrates another embodiment of an electronic system 200 that includes the power conversion circuit 106 coupled between the load 102 and the power source 104. According to this embodiment, a sensor 202 is provided for sensing a current I_R$_{SEN}$ flowing through a resistor R$_{SEN}$ coupled between the power source 104 and the first power disconnect switch 112. The gate driver circuit logic 124 implements the delayed turn on time for the second power disconnect switch 114 based on the sensed current I_R$_{SEN}$ flowing through the resistor R$_{SEN}$. For example, the second gate control signal B may be activated when the sensed current I_R$_{SEN}$ drops below a certain level, e.g., similar to what is shown in FIG. 2 for I_P$_{IN}$.

Figure 6:
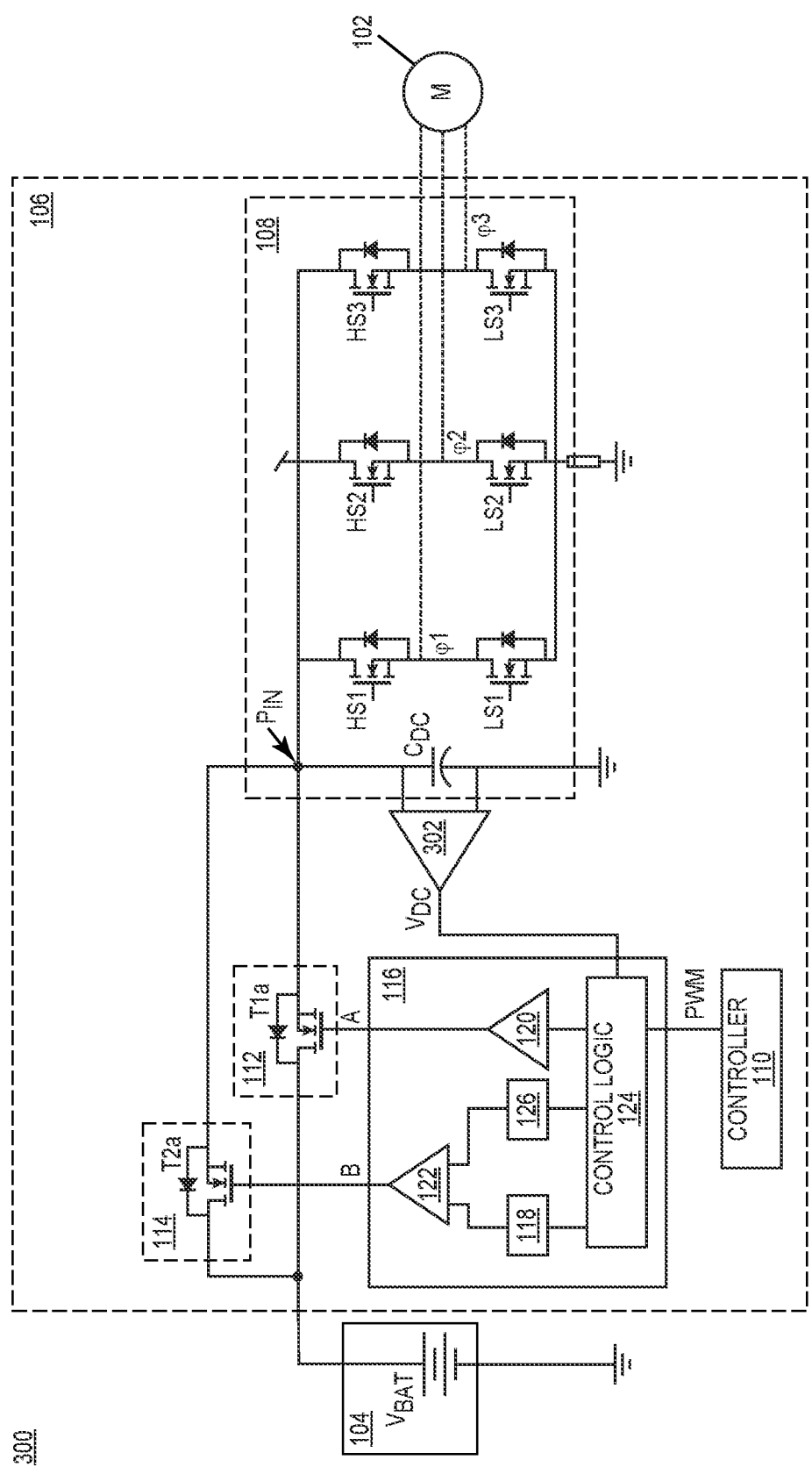

FIG. 6 illustrates another embodiment of an electronic system 300 that includes the power conversion circuit 106 coupled between the load 102 and the power source 104. According to this embodiment, a sensor 302 is provided for sensing the voltage V$_{DC}$ of the bulk or dc bus capacitor C$_{DC}$ that is electrically coupled to the power input node P$_{IN}$ of the inverter/converter 108. The gate driver circuit logic 124 implements the delayed turn on time for the second power disconnect switch 114 based on the sensed voltage V$_{DC}$ of the capacitor C$_{DC}$. For example, the second gate control signal B may be activated when the sensed capacitor voltage V$_{DC}$ rises about a certain level, e.g., 90% or more and which indicates sufficient charging of the capacitor C$_{DC}$ and thus a reduction in the inrush current I_inrush from the peak I_pk.

Figure 7:
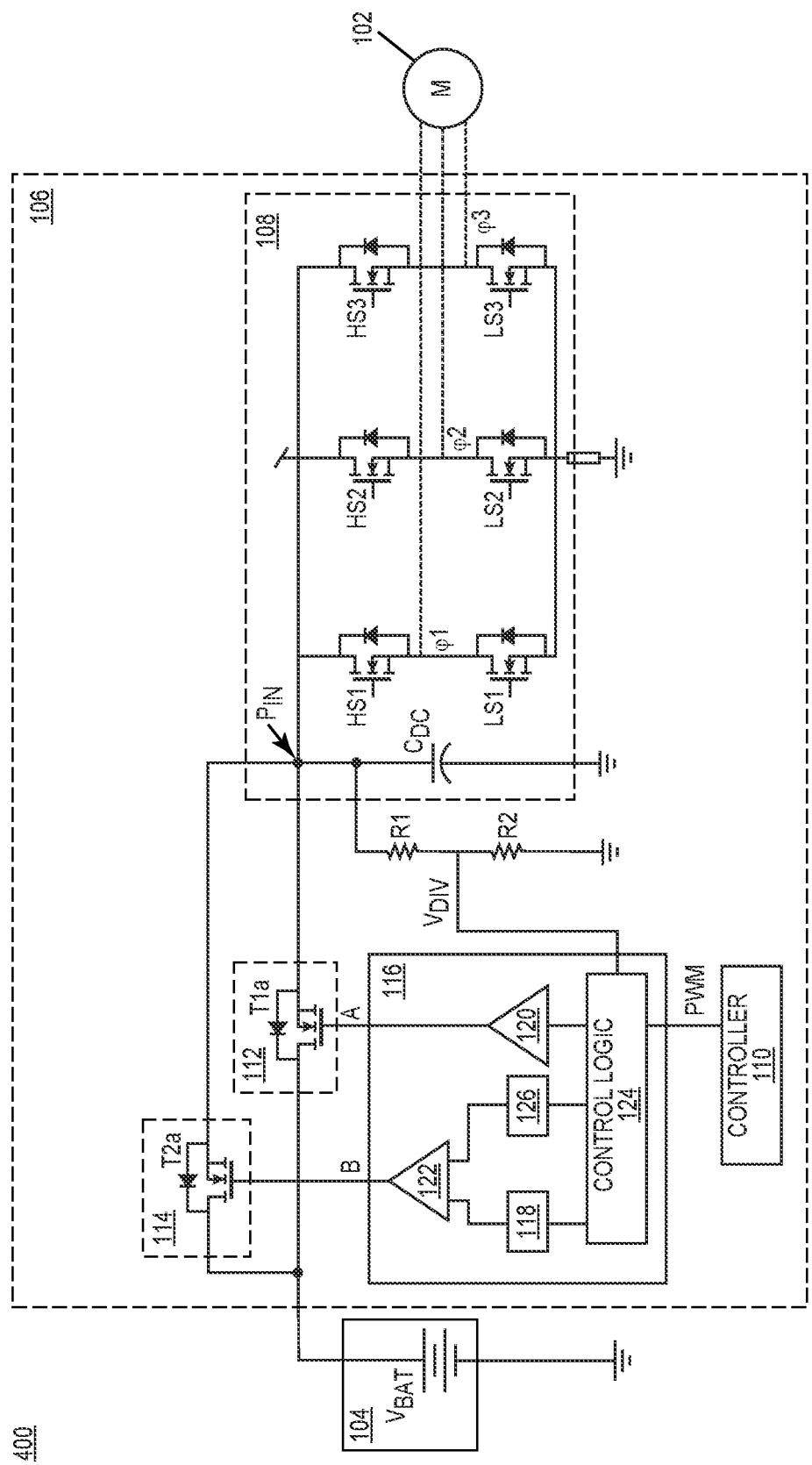

FIG. 7 illustrates another embodiment of an electronic system 400 that includes the power conversion circuit 106 coupled between the load 102 and the power source 104. The embodiment shown in FIG. 7 is similar to the embodiment shown in FIG. 6. Different, however, a resistor divider R1, R2 is used to sense a reduced (lower) voltage V$_{DIV}$ which corresponds to the voltage V$_{DC}$ of the bulk or dc bus capacitor $C_{DC}$. The gate driver circuit logic 124 implements the delayed turn on time for the second power disconnect switch 114 based on the lower sensed voltage $V_{DIV}$. For example, the second gate control signal B may be activated when the lower sensed voltage $V_{DIV}$ rises about a certain level which indicates sufficient charging of the capacitor $C_{DC}$ and thus a reduction in the inrush current I_inrush from the peak I_pk.

Figure 8:
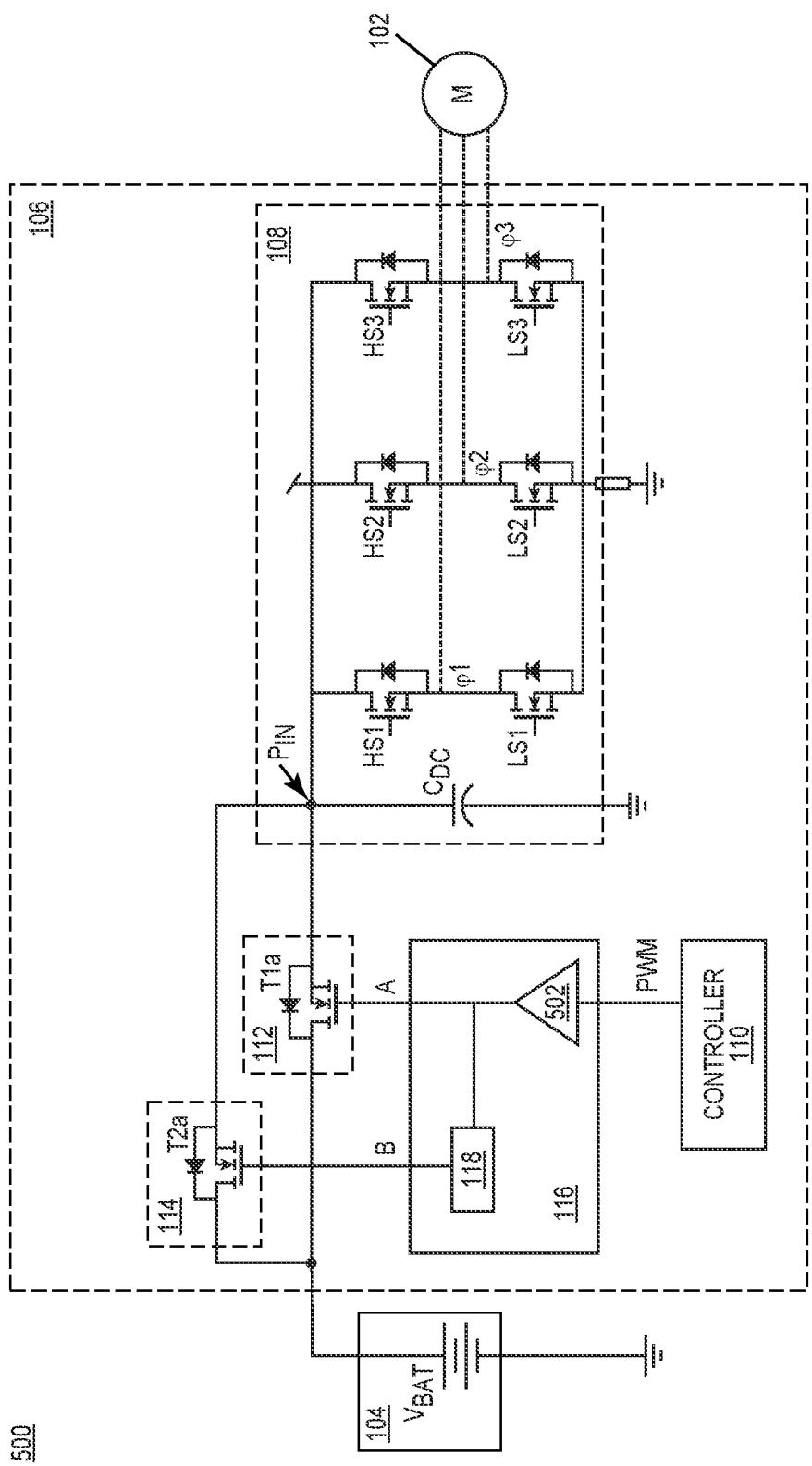

FIG. 8 illustrates another embodiment of an electronic system 500 that includes the power conversion circuit 106 coupled between the load 102 and the power source 104. According to this embodiment, the gate driver circuit 116 implements the delayed turn-on time 118 for the second power disconnect switch 114 but not the delayed turn-off time 126 via a single driver 502. The single driver 502 outputs the first gate control signal A without any intentional delay, e.g., based on a switching control signal PWM received from the controller 110 as previously described herein. The gate driver circuit 116 generates the second gate control signal B by applying the delayed turn on time 118 to the output of the single driver 502.

Figure 9:
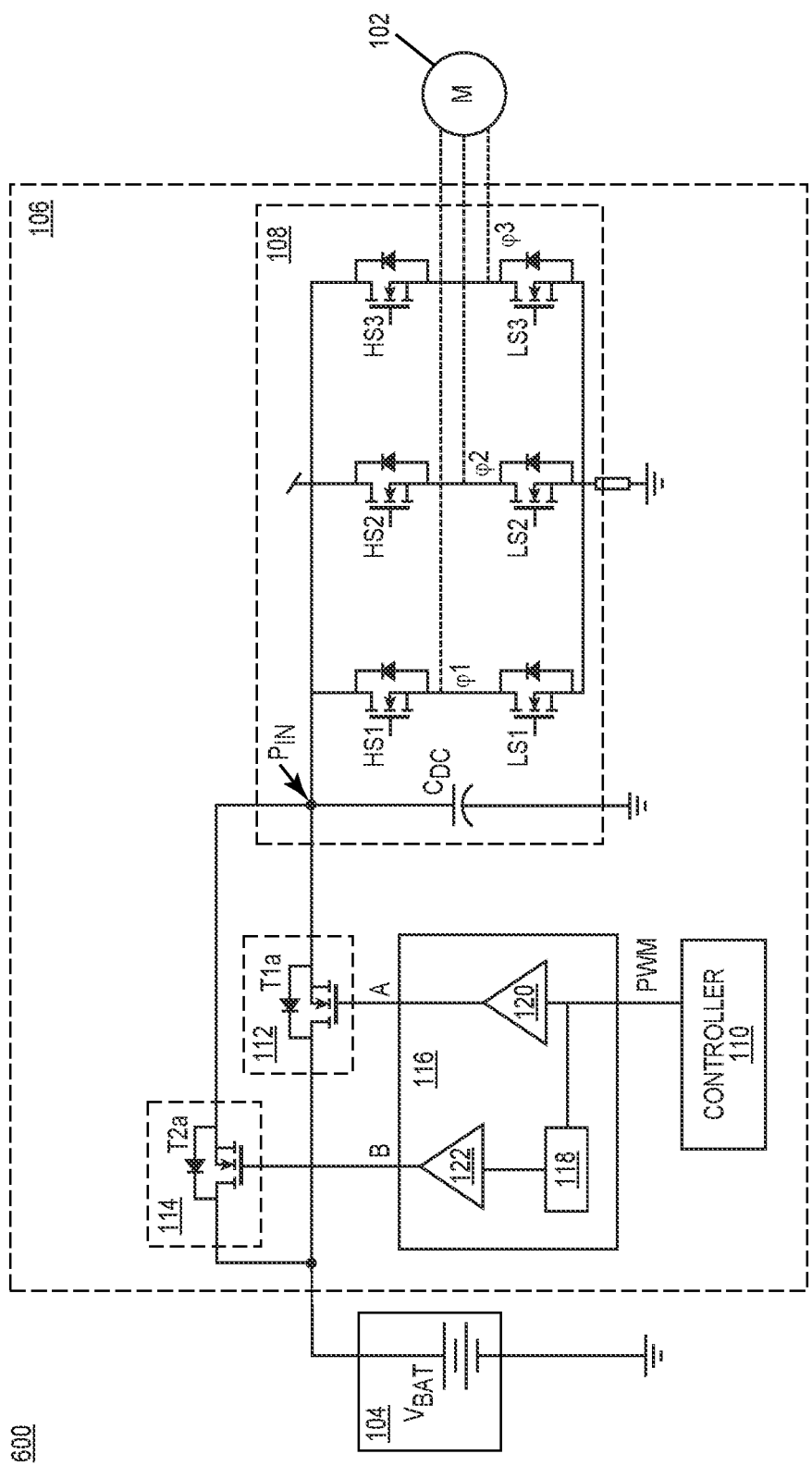

FIG. 9 illustrates another embodiment of an electronic system 600 that includes the power conversion circuit 106 coupled between the load 102 and the power source 104. According to this embodiment, the gate driver circuit 116 implements the delayed turn-on time 118 for the second power disconnect switch 114 but not the delayed turn-off time 126 via two separate drivers 120, 122. The first driver 120 outputs the first gate control signal A without any intentional delay, e.g., based on a switching control signal PWM received from the controller 110 as previously described herein. The gate driver circuit 116 applies the delayed turn on time 118 to the same signal input to the first driver 120. The second driver 122 outputs the second gate control signal B with the added delay.

Figure 10:
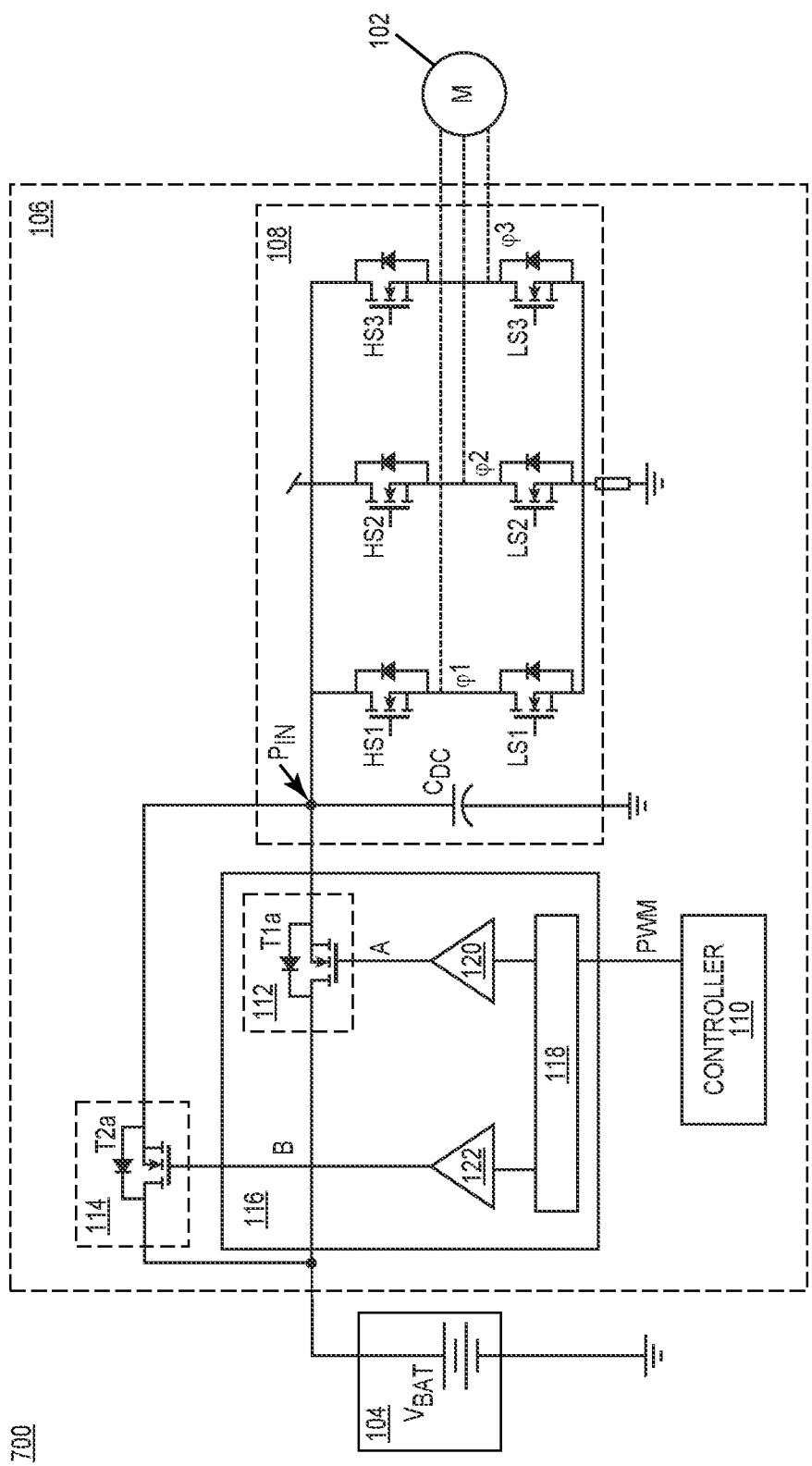

FIG. 10 illustrates another embodiment of an electronic system 700 that includes the power conversion circuit 106 coupled between the load 102 and the power source 104. The embodiment shown in FIG. 10 is similar to the embodiment illustrated in FIG. 9. Different, however, the first power disconnect switch 112 is monolithically integrated with the gate driver circuit 116, e.g., in a common semiconductor die (chip) or module. The second power disconnect switch 114 may be a discrete device, e.g., a different semiconductor die or module separate from the first power disconnect switch 112 and the gate driver circuit 116.

Figure 11:
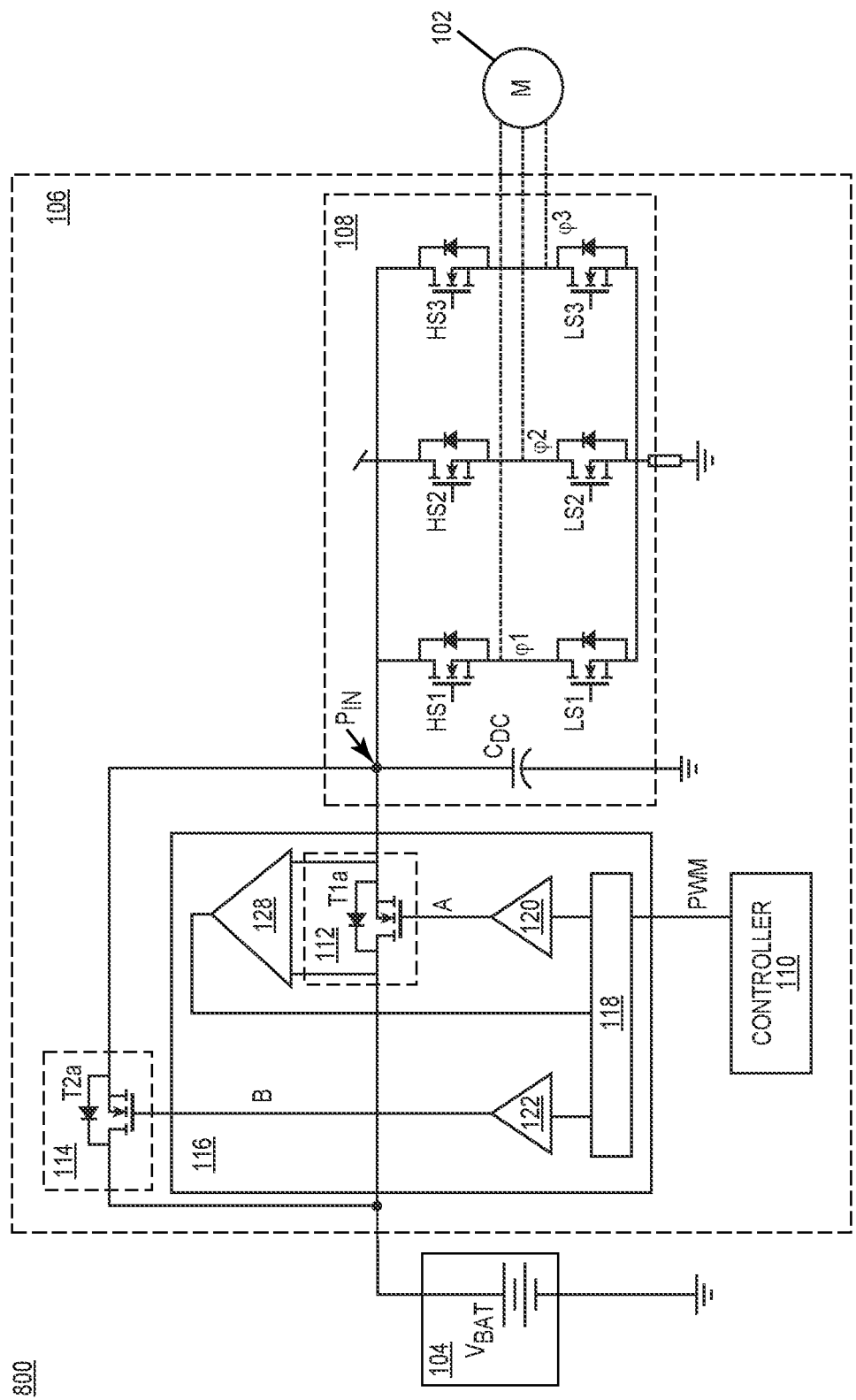

FIG. 11 illustrates another embodiment of an electronic system 800 that includes the power conversion circuit 106 coupled between the load 102 and the power source 104. The embodiment shown in FIG. 11 is similar to the embodiment shown in FIG. 10. Different, however, the sensor 128 for sensing the drain-to-source voltage VDS1 of the first power disconnect switch 112 or a current flowing through the first power disconnect switch 112 is also monolithically integrated with the gate driver circuit 116 and the first power disconnect switch 112.

Although the present disclosure is not so limited, the following numbered examples demonstrate one or more aspects of the disclosure.

Example 1. A gate driver circuit, comprising: at least one driver configured to generate a first gate control signal for a first power disconnect switch and a second gate control signal for a second power disconnect switch in parallel with the first power disconnect switch; and logic configured to implement a delayed turn on time for the second gate control signal compared to the first gate control signal such that the first power disconnect switch turns on before the second power disconnect switch when powering up a load coupled to the first and the second power disconnect switches.

Example 2. The gate driver circuit of example 1, wherein the logic is configured to implement the delayed turn on time based on a sensed drain-to-source voltage of the first power disconnect switch or a sensed current flowing through the first power disconnect switch.

Example 3. The gate driver circuit of example 1 or 2, wherein the logic is configured to implement the delayed turn on time based on a programmed delay value.

Example 4. The gate driver circuit of any of examples 1 through 3, wherein the logic is configured to implement the delayed turn on time based on a sensed current flowing through a resistor coupled between a power source and the first power disconnect switch.

Example 5. The gate driver circuit of any of examples 1 through 4, wherein the logic is configured to implement the delayed turn on time based on a sensed voltage of a capacitor between the first power disconnect switch and ground.

Example 6. The gate driver circuit of any of examples 1 through 5, wherein the load is a power conversion system, and wherein the logic is configured to implement the delayed turn on time based on a sensed voltage of a decoupling bulk capacitor or a dc bus capacitor at an input of the power conversion system that is being charged when the first power disconnect switch is being turned on.

Example 7. The gate driver circuit of any of examples 1 through 6, wherein the gate driver circuit comprises a single driver, wherein the single driver is configured to output the first gate control signal, and wherein the logic is configured to generate the second gate control signal by applying the delayed turn on time to the output of the single driver.

Example 8. The gate driver circuit of any of examples 1 through 7, wherein the gate driver circuit comprises a first driver and a second driver, wherein the first driver is configured to generate the first gate control signal based on a switching control signal received from a controller, and wherein the logic is configured to apply the delayed turn on time to the switching control signal for input to the second driver.

Example 9. The gate driver circuit of any of examples 1 through 8, wherein the logic is further configured to implement a delayed turn off time for the second gate control signal compared to the first gate control signal such that the first power disconnect switch turns off before the second power disconnect switch when powering down the load coupled to the first and the second power disconnect switches.

Example 10. The gate driver circuit of example 9, wherein the delayed turn off time is such that the first power disconnect switch is completely turned off before the second power disconnect switch begins to turn off.

Example 11. The gate driver circuit of example 9 or 10, wherein the delayed turn off time is such that the second power disconnect switch has a controlled turn off when powering down the load coupled to the first and the second power disconnect switches.

Example 12. The gate driver circuit of any of examples 9 through 11, wherein the logic is configured to implement the delayed turn off time based on a programmed delay value.

Example 13. The gate driver circuit of any of examples 1 through 12, wherein the first power disconnect switch is monolithically integrated with the gate driver circuit.

Example 14. The gate driver circuit of any of examples 1 through 13, wherein the first power disconnect switch comprises a plurality of first transistors coupled in parallel and controlled by the same first gate control signal, and wherein the second power disconnect switch comprises a plurality of second transistors coupled in parallel and controlled by the same second gate control signal.

Example 15. A power conversion circuit, comprising: an inverter/converter; a capacitor electrically coupled to a power input node of the inverter/converter; a first transistor electrically coupled between a power input node of the power conversion circuit and the power input node of the inverter/converter; a second transistor in parallel with the first transistor and electrically coupled between the power input node of the power conversion circuit and the power input node of the inverter/converter; a controller configured to operate the first transistor and the second transistor as disconnect switches when disconnecting the power input node of the power conversion circuit from the power input node of the inverter/converter; and a gate driver circuit configured to generate a first gate control signal for the first transistor and a second gate control signal for the second transistor, the second gate control signal having a delayed turn on time compared to the first gate control signal such that the first transistor turns on before the second transistor when powering up a load coupled to the first and the second power disconnect switches.

Example 16. The power conversion circuit of example 15, further comprising: a sensor configured to sense a drain-to-source voltage of the first transistor or a current flowing through the first transistor, wherein the gate driver circuit is configured to implement the delayed turn on time based on the sensed drain-to-source voltage of the first transistor or the sensed current flowing through the first transistor.

Example 17. The power conversion circuit of example 15 or 16, wherein the gate driver circuit is configured to implement the delayed turn on time based on a programmed delay value.

Example 18. The power conversion circuit of any of examples 15 through 17, further comprising: a sensor configured to sense a current flowing through a resistor coupled between a power source and the first transistor, wherein the gate driver circuit is configured to implement the delayed turn on time based on the sensed current flowing through the resistor.

Example 19. The power conversion circuit of any of examples 15 through 18, further comprising: a sensor configured to sense a voltage of the capacitor, wherein the gate driver circuit is configured to implement the delayed turn on time based on the sensed voltage of the capacitor.

Example 20. The power conversion circuit of any of examples 15 through 19, wherein the gate driver circuit is further configured to generate the first gate control signal and the second gate control signal such that the second gate control signal has a delayed turn off time compared to the first gate control signal and the first transistor turns off before the second transistor when powering down the load coupled to the first and the second power disconnect switches.

Example 21. The power conversion circuit of any of examples 15 through 20, wherein the first transistor has a different gate charge characteristic and a different plateau voltage compared to the second transistor.

Example 22. The power conversion circuit of any of examples 15 through 21, further comprising: one or more additional first transistors coupled in parallel with the first transistor and controlled by the first gate control signal; and one or more additional second transistors coupled in parallel with the second transistor and controlled by the second gate control signal.

Example 23. The power conversion circuit of any of examples 15 through 22, wherein the first transistor is monolithically integrated with the gate driver circuit, and wherein the second transistor is a discrete device separate from the first transistor and the gate driver circuit.

Example 24. An electronic system, comprising: a load; an inverter/converter coupled to the load; a capacitor electrically coupled to a power input node of the inverter/converter; a power source; a first transistor electrically coupled between the power source and the power input node of the inverter/converter; a second transistor in parallel with the first transistor and electrically coupled between the power source and the power input node of the inverter/converter; a controller configured to operate the first transistor and the second transistor as disconnect switches when disconnecting the power source from the load; and a gate driver circuit configured to generate a first gate control signal for the first transistor and a second gate control signal for the second transistor, the second gate control signal having a delayed turn on time compared to the first gate control signal such that the first transistor turns on before the second transistor when powering up the load.

Example 25. The electronic system of example 24, wherein the load is a multi-phase motor and the power source is a battery.

Example 26. The electronic system of example 24 or 25, wherein the gate driver circuit is further configured to generate the first gate control signal and the second gate control signal such that the second gate control signal has a delayed turn off time compared to the first gate control signal and the first transistor turns off before the second transistor when powering down the load.

Example 27. A method of driving a first power disconnect switch and a second power disconnect switch coupled in parallel with the first power disconnect switch, the method comprising: generating a first gate control signal for the first power disconnect switch and a second gate control signal for the second power disconnect switch; and implementing a delayed turn on time for the second gate control signal compared to the first gate control signal such that the first power disconnect switch turns on before the second power disconnect switch when powering up a load coupled to the first and the second power disconnect switches.

Example 28. The method of example 27, further comprising: implementing a delayed turn off time for the second gate control signal compared to the first gate control signal such that the first power disconnect switch turns off before the second power disconnect switch when powering down the load.

Example 29. The method of example 28 or 29, wherein the delayed turn off time is implemented such that the first transistor is completely turned off before the second transistor begins to turn off.

Example 30. The method of example 28 or 29, wherein the second gate control signal is generated such that the second transistor has a controlled turn off when powering down the load.

Example 31. A power conversion circuit, comprising: an inverter/converter; a bulk capacitor electrically coupled to a power input node of the inverter/converter; a first transistor electrically coupled between a power input node of the power conversion circuit and the power input node of the inverter/converter; a second transistor in parallel with the first transistor and electrically coupled between the power input node of the power conversion circuit and the power input node of the inverter/converter; a controller configured to operate the first transistor and the second transistor as disconnect switches when disconnecting the power input node of the power conversion circuit from the power input node of the inverter/converter; and a gate driver circuit configured to generate a first gate control signal for the first transistor and a second gate control signal for the second transistor, the second gate control signal having a delayed turn on time compared to the first gate control signal such that the first transistor turns on before the second transistor and the capacitor begins to draw an inrush current through the first transistor but not the second transistor.

Example 32. The power conversion circuit of example 31, wherein the delayed turn on time is such that the inrush current reaches a peak and begins to drop to a lower level before the second power disconnect switch is turned on.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A gate driver circuit, comprising:
    at least one driver configured to generate a first gate control signal for a first power disconnect switch and a second gate control signal for a second power disconnect switch in parallel with the first power disconnect switch; and
    logic configured to implement a delayed turn on time for the second gate control signal compared to the first gate control signal such that the first power disconnect switch turns on before the second power disconnect switch when powering up a load coupled to the first and the second power disconnect switches,
    wherein the logic is configured to implement the delayed turn on time based on a sensed drain-to-source voltage of the first power disconnect switch or a sensed current flowing through the first power disconnect switch.

2. The gate driver circuit of claim 1, wherein the logic is configured to implement the delayed turn on time based on a programmed delay value.

3. The gate driver circuit of claim 1, wherein the logic is configured to implement the delayed turn on time based on a sensed current flowing through a resistor coupled between a power source and the first power disconnect switch.

4. The gate driver circuit of claim 1, wherein the logic is configured to implement the delayed turn on time based on a sensed voltage of a capacitor between the first power disconnect switch and ground.

5. The gate driver circuit of claim 1, wherein the load is a power conversion system, and wherein the logic is configured to implement the delayed turn on time based on a sensed voltage of a decoupling bulk capacitor or a dc bus capacitor at an input of the power conversion system that is being charged when the first power disconnect switch is being turned on.

6. The gate driver circuit of claim 1, wherein the gate driver circuit comprises a single driver, wherein the single driver is configured to output the first gate control signal, and wherein the logic is configured to generate the second gate control signal by applying the delayed turn on time to the output of the single driver.

7. The gate driver circuit of claim 1, wherein the gate driver circuit comprises a first driver and a second driver, wherein the first driver is configured to generate the first gate control signal based on a switching control signal received from a controller, and wherein the logic is configured to apply the delayed turn on time to the switching control signal for input to the second driver.

8. The gate driver circuit of claim 1, wherein the logic is further configured to implement a delayed turn off time for the second gate control signal compared to the first gate control signal such that the first power disconnect switch turns off before the second power disconnect switch when powering down the load coupled to the first and the second power disconnect switches.

9. The gate driver circuit of claim 8, wherein the delayed turn off time is such that the first power disconnect switch is completely turned off before the second power disconnect switch begins to turn off.

10. The gate driver circuit of claim 8, wherein the delayed turn off time is such that the second power disconnect switch has a controlled turn off when powering down the load coupled to the first and the second power disconnect switches.

11. The gate driver circuit of claim 8, wherein the logic is configured to implement the delayed turn off time based on a programmed delay value.

12. The gate driver circuit of claim 1, wherein the first power disconnect switch is monolithically integrated with the gate driver circuit.

13. A power conversion circuit, comprising:
    an inverter/converter;
    a capacitor electrically coupled to a power input node of the inverter/converter;
    a first transistor electrically coupled between a power input node of the power conversion circuit and the power input node of the inverter/converter;
    a second transistor in parallel with the first transistor and electrically coupled between the power input node of the power conversion circuit and the power input node of the inverter/converter;
    a controller configured to operate the first transistor and the second transistor as disconnect switches when disconnecting the power input node of the power conversion circuit from the power input node of the inverter/converter; and
    a gate driver circuit configured to generate a first gate control signal for the first transistor and a second gate control signal for the second transistor, the second gate control signal having a delayed turn on time compared to the first gate control signal such that the first transistor turns on before the second transistor when powering up a load coupled to the first and the second power disconnect switches.

14. The power conversion circuit of claim 13, further comprising:
a sensor configured to sense a drain-to-source voltage of the first transistor or a current flowing through the first transistor,
wherein the gate driver circuit is configured to implement the delayed turn on time based on the sensed drain-to-source voltage of the first transistor or the sensed current flowing through the first transistor.

15. The power conversion circuit of claim 13, wherein the gate driver circuit is configured to implement the delayed turn on time based on a programmed delay value.

16. The power conversion circuit of claim 13, further comprising:
a sensor configured to sense a current flowing through a resistor coupled between a power source and the first transistor,
wherein the gate driver circuit is configured to implement the delayed turn on time based on the sensed current flowing through the resistor.

17. The power conversion circuit of claim 13, further comprising:
a sensor configured to sense a voltage of the capacitor,
wherein the gate driver circuit is configured to implement the delayed turn on time based on the sensed voltage of the capacitor.

18. The power conversion circuit of claim 13, wherein the gate driver circuit is further configured to generate the first gate control signal and the second gate control signal such that the second gate control signal has a delayed turn off time compared to the first gate control signal and the first transistor turns off before the second transistor when powering down the load coupled to the first and the second power disconnect switches.

19. The power conversion circuit of claim 13, wherein the first transistor has a different gate charge characteristic and a different plateau voltage compared to the second transistor.

20. The power conversion circuit of claim 13, further comprising:
one or more additional first transistors coupled in parallel with the first transistor and controlled by the first gate control signal; and
one or more additional second transistors coupled in parallel with the second transistor and controlled by the second gate control signal.

21. The power conversion circuit of claim 13, wherein the first transistor is monolithically integrated with the gate driver circuit, and wherein the second transistor is a discrete device separate from the first transistor and the gate driver circuit.

22. An electronic system, comprising:
a load;
an inverter/converter coupled to the load;
a capacitor electrically coupled to a power input node of the inverter/converter;
a power source;
a first transistor electrically coupled between the power source and the power input node of the inverter/converter;
a second transistor in parallel with the first transistor and electrically coupled between the power source and the power input node of the inverter/converter;
a controller configured to operate the first transistor and the second transistor as disconnect switches when disconnecting the power source from the load; and
a gate driver circuit configured to generate a first gate control signal for the first transistor and a second gate control signal for the second transistor, the second gate control signal having a delayed turn on time compared to the first gate control signal such that the first transistor turns on before the second transistor when powering up the load.

23. The electronic system of claim 22, wherein the load is a multi-phase motor and the power source is a battery.

24. The electronic system of claim 22, wherein the gate driver circuit is further configured to generate the first gate control signal and the second gate control signal such that the second gate control signal has a delayed turn off time compared to the first gate control signal and the first transistor turns off before the second transistor when powering down the load.

25. A power conversion circuit, comprising:
an inverter/converter;
a bulk capacitor electrically coupled to a power input node of the inverter/converter;
a first transistor electrically coupled between a power input node of the power conversion circuit and the power input node of the inverter/converter;
a second transistor in parallel with the first transistor and electrically coupled between the power input node of the power conversion circuit and the power input node of the inverter/converter;
a controller configured to operate the first transistor and the second transistor as disconnect switches when disconnecting the power input node of the power conversion circuit from the power input node of the inverter/converter; and
a gate driver circuit configured to generate a first gate control signal for the first transistor and a second gate control signal for the second transistor, the second gate control signal having a delayed turn on time compared to the first gate control signal such that the first transistor turns on before the second transistor and the capacitor begins to draw an inrush current through the first transistor but not the second transistor.

26. The power conversion circuit of claim 25, wherein the delayed turn on time is such that the inrush current reaches a peak and begins to drop to a lower level before the second power disconnect switch is turned on.

27. A gate driver circuit, comprising:
at least one driver configured to generate a first gate control signal for a first power disconnect switch and a second gate control signal for a second power disconnect switch in parallel with the first power disconnect switch; and
logic configured to implement a delayed turn on time for the second gate control signal compared to the first gate control signal such that the first power disconnect switch turns on before the second power disconnect switch when powering up a load coupled to the first and the second power disconnect switches,
wherein the logic is configured to implement the delayed turn on time based on a sensed current flowing through a resistor coupled between a power source and the first power disconnect switch.

28. A gate driver circuit, comprising:
at least one driver configured to generate a first gate control signal for a first power disconnect switch and a second gate control signal for a second power disconnect switch in parallel with the first power disconnect switch; and
logic configured to implement a delayed turn on time for the second gate control signal compared to the first gate control signal such that the first power disconnect switch turns on before the second power disconnect switch when powering up a load coupled to the first and the second power disconnect switches, wherein the logic is configured to implement the delayed turn on time based on a sensed voltage of a capacitor between the first power disconnect switch and ground.

29. A gate driver circuit, comprising:

at least one driver configured to generate a first gate control signal for a first power disconnect switch and a second gate control signal for a second power disconnect switch in parallel with the first power disconnect switch; and logic configured to implement a delayed turn on time for the second gate control signal compared to the first gate control signal such that the first power disconnect switch turns on before the second power disconnect switch when powering up a load coupled to the first and the second power disconnect switches, wherein the load is a power conversion system, wherein the logic is configured to implement the delayed turn on time based on a sensed voltage of a decoupling bulk capacitor or a dc bus capacitor at an input of the power conversion system that is being charged when the first power disconnect switch is being turned on.

* * * * *